United States Patent
Ito et al.

(10) Patent No.: US 10,892,273 B2
(45) Date of Patent: Jan. 12, 2021

(54) SEMICONDUCTOR MEMORY DEVICE

(71) Applicant: TOSHIBA MEMORY CORPORATION, Minato-ku (JP)

(72) Inventors: Sachiyo Ito, Kawasaki (JP); Ken Furubayashi, Yokohama (JP); Hiroshi Yoshimura, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/456,387

(22) Filed: Jun. 28, 2019

(65) Prior Publication Data
US 2020/0251484 A1 Aug. 6, 2020

(30) Foreign Application Priority Data

Feb. 5, 2019 (JP) .................................. 2019-018875

(51) Int. Cl.
*H01L 27/11578* (2017.01)
*H01L 27/11568* (2017.01)
*H01L 27/11565* (2017.01)

(52) U.S. Cl.
CPC .. *H01L 27/11578* (2013.01); *H01L 27/11565* (2013.01); *H01L 27/11568* (2013.01)

(58) Field of Classification Search
CPC ......... H01L 27/11578; H01L 27/11568; H01L 27/11565
See application file for complete search history.

(56) References Cited

U.S. PATENT DOCUMENTS

| | | | |
|---|---|---|---|
| 10,083,983 B2 | 9/2018 | Noda et al. | |
| 10,096,613 B2 | 10/2018 | Takahashi et al. | |
| 2013/0009274 A1* | 1/2013 | Lee | H01L 29/02 257/499 |
| 2016/0322381 A1* | 11/2016 | Liu | H01L 29/40114 |
| 2018/0138197 A1 | 5/2018 | Kitahara | |
| 2018/0240811 A1 | 8/2018 | Kim et al. | |
| 2018/0247950 A1* | 8/2018 | Yun | H01L 27/11582 |
| 2018/0269221 A1 | 9/2018 | Oda et al. | |
| 2020/0168513 A1* | 5/2020 | Sawai | H01L 22/12 |

FOREIGN PATENT DOCUMENTS

| | | |
|---|---|---|
| JP | 2018-157096 | 10/2018 |
| TW | I616985 B | 3/2018 |

* cited by examiner

*Primary Examiner* — Mohammed R Alam
(74) *Attorney, Agent, or Firm* — Oblon, McClelland, Maier & Neustadt, L.L.P.

(57) ABSTRACT

A semiconductor memory device of an embodiment includes a stacked body having a stepped portion in which a plurality of metal layers is stacked via an insulating layer, and end portions of the plurality of metal layers are formed in a stepwise manner, a plurality of columnar portions arranged in steps of the stepped portion and penetrating the stepped portion, and a band portion provided near a leading end portion of the metal layer of a lowermost step of the stepped portion, the band portion extending in a first direction along the leading end portion and dividing the stacked body and a peripheral region of the stacked body, in which a coverage of the columnar portions arranged in the lowermost step is larger than a coverage of the columnar portions arranged in an upper step adjacent to the lowermost step only in a second direction toward a region where memory cells are arranged.

20 Claims, 10 Drawing Sheets

COVERAGE: 30%

FIG.10

COVERAGE: >50%

SEMICONDUCTOR MEMORY DEVICE

CROSS-REFERENCE TO RELATED APPLICATIONS

This application is based upon and claims the benefit of priority from Japanese Patent Application No. 2019-018875, filed on Feb. 5, 2019; the entire contents of which are incorporated herein by reference.

FIELD

Embodiments described herein relate generally to a semiconductor memory device.

BACKGROUND

In a three-dimensional nonvolatile memory, memory cells are three-dimensionally arranged with respect to a plurality of stacked wiring layers. In such a configuration, how to maintain the strength of the stacked structure is an issue.

DETAILED DESCRIPTION

A semiconductor memory device according to an embodiment includes a stacked body having a stepped portion in which a plurality of metal layers is stacked via an insulating layer, and end portions of the plurality of metal layers are formed in a stepwise manner, a plurality of pillars extending in a stacking direction of the stacked body to penetrate the stacked body from an uppermost metal layer to a lowermost metal layer of the stacked body, and forming a plurality of memory cells at respective intersections with at least metal layers arranged near a center of the stacked body, of the plurality of metal layers, a plurality of columnar portions arranged in steps of the stepped portion and penetrating the stepped portion, and a band portion provided near a leading end portion of the metal layer of a lowermost step of the stepped portion, the band portion extending in a first direction along the leading end portion and dividing the stacked body and a peripheral region of the stacked body, in which a coverage of the columnar portions arranged in the lowermost step is larger than a coverage of the columnar portions arranged in an upper step adjacent to the lowermost step only in a second direction toward a region where the memory cells are arranged.

Hereinafter, the present invention will be described in detail with reference to the drawings. Note that the present invention is not limited to the following embodiment. Further, constituent elements in the following embodiment include those easily assumed by a person skilled in the art or those substantially the same.

Embodiment

Semiconductor memory devices according to an embodiment and modifications will be described with reference to FIGS. 1A to 10.

(Configuration Example of Semiconductor Memory Device)

Figures 1A, 1B:
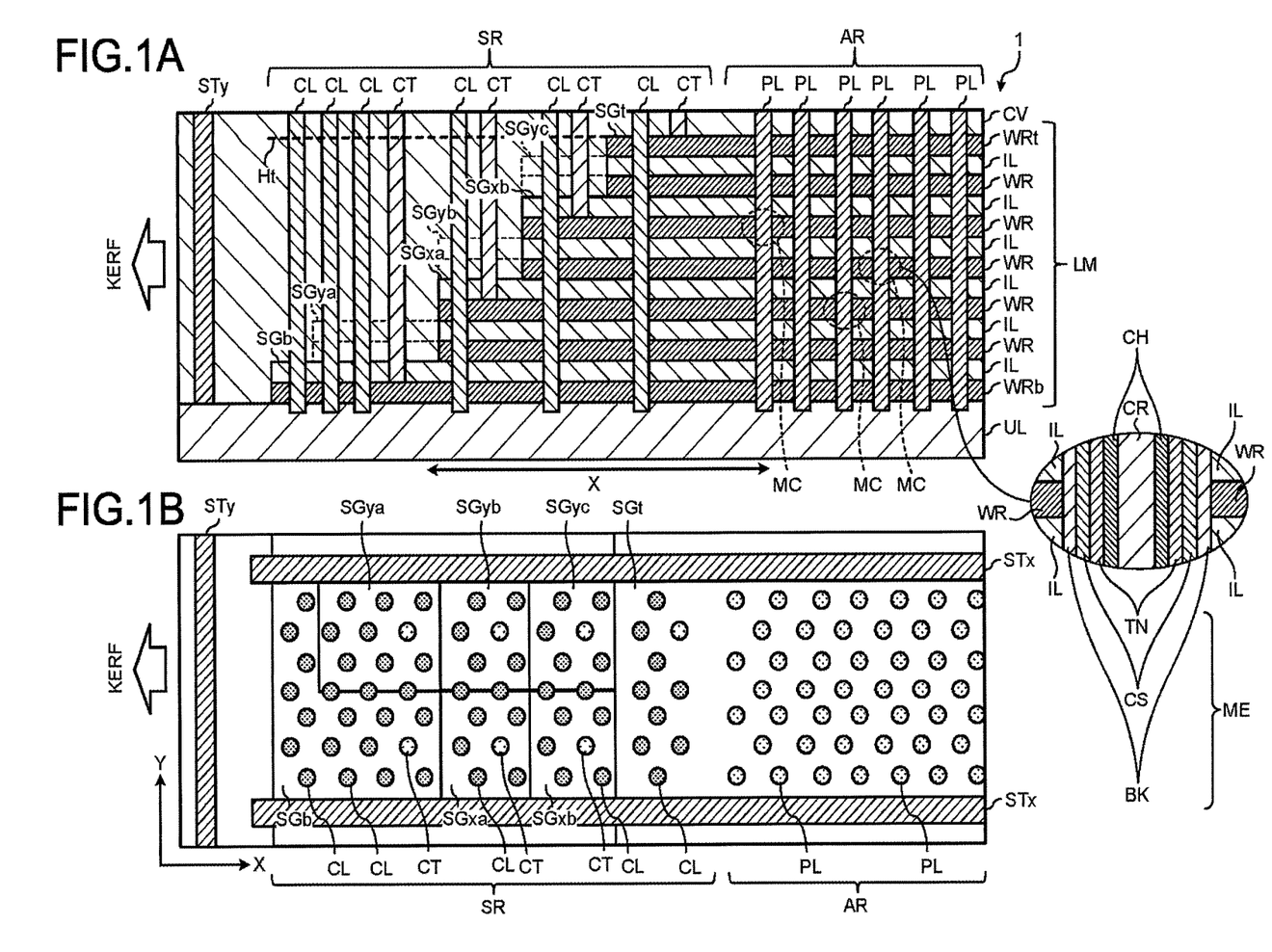
FIG. 1A and FIG. 1B are views illustrating a configuration example of a semiconductor memory device according to an embodiment.

FIG. 1A is a diagram illustrating a configuration example of a semiconductor memory device 1 according to an embodiment. FIG. 1A is a cross-sectional view of the semiconductor memory device 1 along an X direction and FIG. 1B is a plan view of the semiconductor memory device 1. Note that, in FIG. 1B, an insulating layer CV above a stacked body LM is omitted. In the specification, up-and-down directions are defined based on a shape of a later-described stepped portion SR. More particularly, the up direction is a direction in which a terrace portion of the stepped portion SR faces, i.e., the up direction is a direction in which an exposed surface of an interlayer insulating layer IL in each step of the stepped portion SR faces.

As illustrated in FIGS. 1A and 1B, the semiconductor memory device 1 includes the stacked body LM in which a plurality of insulating layers IL and a plurality of wiring layers WR are alternately stacked on a base structure UL. The base structure UL may be a substrate such as a silicon substrate arranged on the stacked body LM via an insulating layer or a structure having a source line or the like further interposed between the insulating layer and a substrate. The insulating layer IL is, for example, a $SiO_2$ layer or the like and functions as an interlayer insulating layer. The wiring layer WR is, for example, a metal layer such as a W layer or a Mo layer. In FIG. 1A, a wiring layer WRb is the lowermost wiring layer WR and a wiring layer WRt is the uppermost wiring layer WR. Note that the number of stacked layers of the wiring layers WR may be any number, for example, about 100.

The stacked body LM is divided into a plurality of parts by slits STx extending in the X direction. The slit STx is a trench penetrating the stacked body LM from the wiring layer WRt to the wiring layer WRb, and the slit STx is filled with, for example, an insulating layer. A conductive layer may be filled in the slit STx using an insulating layer as a liner, and the slit STx may be used as a source line contact or the like.

The stacked body LM is cut off from a peripheral region of the stacked body LM by a slit STy extending in a Y direction near a leading end portion of the stacked body LM in the K direction. The slit STy is a trench penetrating the insulating layer CV covering the entire stacked body LM and reaching the base structure UL, and the slit STy is filled with an insulating layer, for example. The peripheral region of the stacked body LM is a region up to reaching a kerf from near the leading end portion of the stacked body LM in the X direction. The slit STy is arranged at a position within 5 μm, more favorably, within 1 μm, from the leading end portion of the stacked body LM in the X direction toward the kerf.

Note that an end portion of the slit STx may be connected to a side surface of the slit STy regardless of the example in FIG. 1B.

The stacked body LM includes a cell array portion AR in which a plurality of memory cells MC is three-dimensionally arranged. The memory cell MC is formed in a side surface of a pillar PL penetrating the stacked body LM from the wiring layer WRt to the wiring layer WRb and reaching the base structure UL and at a height position of each wiring layer WR.

The pillar PL has, for example, a shape close to a perfect circle in top view, and the pillars PL are arranged in a staggered pattern or a square lattice pattern in the cell array portion AR. The pillar PL has a columnar core portion CR and a channel layer CH covering a side surface and a bottom surface of the core portion CR. Further, the pillar PL includes a memory layer ME covering a side surface of the channel layer CH. The memory layer ME has, in order from a side of the side surface of the channel layer CH, a tunnel insulating layer TN, a charge storage layer CS, and a block insulating layer BK. The core portion CR, the tunnel insulating layer TN, and the block insulating layer BK are, for example, $SiO_2$ layers or the like. The channel layer CH is, for example, an amorphous silicon layer or a polysilicon layer. The charge storage layer CS is, for example, a SiN layer or the like. The memory cell MC is formed from the channel layer CH and the memory layer ME at the height position of each wiring layer WR.

Here, among the above-described wiring layers WR, the wiring layers WR connected to the memory cells MC at the same height position function as a word line. When a predetermined voltage is applied to the word line, data writing and reading with respect to the memory cell MC are performed. Further, one or more lower wiring layers WR including the lowermost wiring layer WRb and one or more upper wiring layers WR including the uppermost wiring layer WRt may function as a selection gate line. When a selection gate belonging to a predetermined pillar PL and connected to the selection gate line is turned on or off, the memory cells MC belonging to the pillar PL are brought into a selected or non-selected state.

Note that the lower wiring layers WR including the lowermost wiring layer WRb may be made to function as the word line without functioning as the selection gate line, and a nonmetal layer such as a polysilicon layer may be separately provided below the stacked body LM and used as a selection gate line. This selection gate line by the nonmetal layer is not included in the stacked body LM. Therefore, the above-described wiring layers WRb and WRt correspond to the lowermost layer and the uppermost layer of the wiring layers WR as the metal layers constituting the stacked body LM.

The stacked body LM includes a stepped portion SR in which end portions of the insulating layers IL and the wiring layers WR are formed in a stepwise manner in an outer peripheral portion in the X direction.

The stepped portion SR includes a lowermost step SGb having a terrace portion wider than the other steps in the leading end portion of the stacked body LM. Further, the stepped portion SR includes steps SGxa and SGxb that are stepped up by two wiring layers WR at a time toward the cell array portion AR in the X direction. That is, the terrace portion of the lowermost step SGb is arranged at a position between the slit STy extending in the Y direction and the steps SGxa and SGxb in the X direction. The steps SGxa and SGxb do not have a wide terrace portion like the lowermost step SGb. Further, the stepped portion SR includes steps SGya, SGyb, and SGyc that are stepped up by one wiring layer WR at a time on a Y-direction side with respect to the steps SGb, SGxa, and SGxb. The cross sectional view of FIG. 1A illustrates the steps SGya, SGyb, and SGyc by dotted lines. Note that the step SGya is also located on an X-direction side with respect to the lowermost step SGb and has a relatively wider terrace portion than the other steps, similarly to the lowermost step SGb. The other steps SGyb and SGyc do not have a wide terrace portion like the lowermost step SGb. The lowermost step SGb belongs to the above-described wiring layer WRb, and the wiring layer WRt forms an uppermost step SGt.

A contact CT for connecting the wiring layer PR and upper layer wiring is arranged in each of the steps SGb, SGxa, SGxb, SGya, SGyb, SGyc, and SGt of the stepped portion SR. Each contact CT is connected to the uppermost wiring layer WR in each of the steps SGt, SGxa, SGxb, SGya, SGyb, SGyc, and SGt. The contact CT is, for example, a W layer, or the like.

A plurality of columnar portions CL supporting the stacked body LM is arranged in each of the steps SGb, SGxa, SGxb, SGya, SGyb, SGyc, and SGt of the stepped portion SR. Each columnar portion CL has, for example, a shape close to a perfect circle in top view, and the size of the columnar portion CL is, for example, about the same as that of the pillar PL. The columnar portion CL penetrates the insulating layer CV and the stepped portion SR from a height equal to or higher than a height position Ht of an upper surface of the wiring layer WRt and reaches the base structure UL. The columnar portion CL is configured by, for example, a similar member to the pillar PL. That is, the columnar portion CL includes, in order from a central portion, an $SiO_2$ layer, an amorphous silicon layer or a polysilicon layer, an $SiO_2$ layer, an SiN layer, an $SiO_2$ layer, and the like. However, the columnar portion CL may not be configured by a similar member to the pillar PL, and in this case, the columnar portion CL can be configured by a single layer or a plurality of layers of a $SiO_2$ layer or a SiN layer, for example.

(Arrangement Example of Columnar Portions)

Figure 2A:
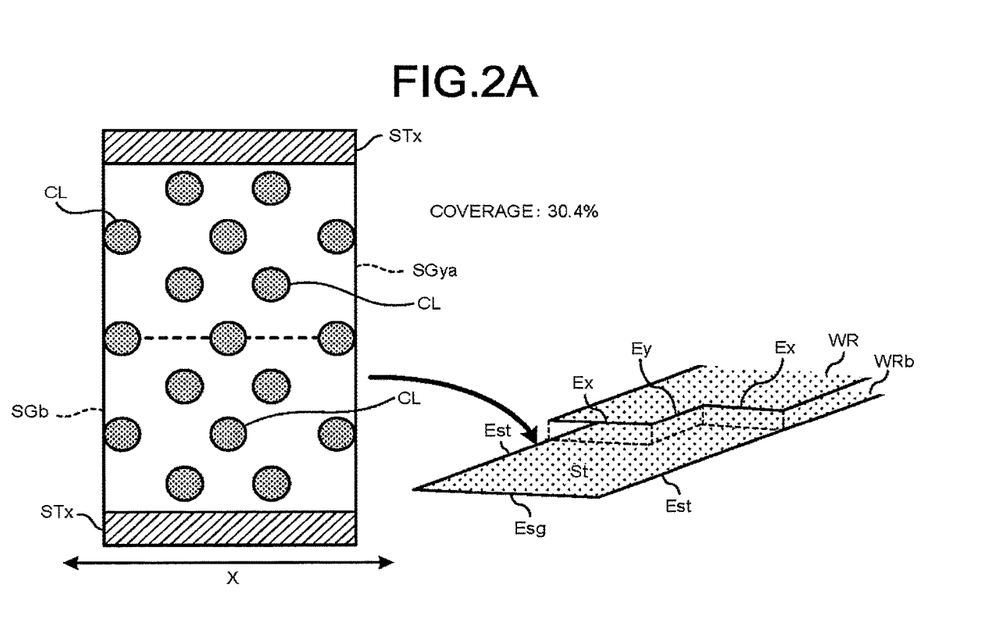
FIG. 2A and FIG. 2B are a plan view and a perspective view illustrating an arrangement example of a columnar portion provided in the semiconductor memory device according to the embodiment.
Figure 2B:
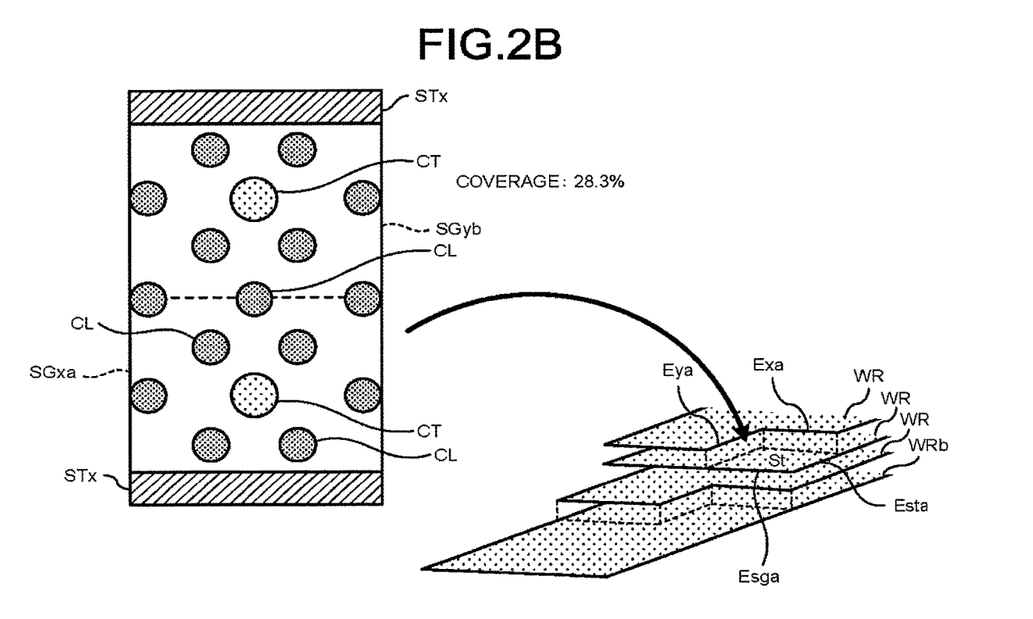

Next, an arrangement example of the columnar portions CL provided in the semiconductor memory device 1 will be described with reference to FIGS. 2A and 2B. FIG. 2A and FIG. 2B are a plan view and a perspective view illustrating an arrangement example of the columnar portions CL provided in the semiconductor memory device 1 according to the embodiment. FIGS. 2A and 2B illustrate plan views at the height position Ht (see FIG. 1A) of the upper surface of the uppermost wiring layer WRt.

The left side in FIG. 2A illustrates a plan view at the height position Ht of the upper surface of the wiring layer WRt above the lowermost step SGb and the step SGya adjacent both in the X direction and the Y direction to the lowermost step SGb. As illustrated on the left side in FIG. 2A, a plurality of columnar portions CL is arranged in a staggered pattern in the lowermost step SGb. The staggered pattern is, for example, an array in which the columnar portions CL of one line are arranged at a predetermined pitch in the X direction, and the columnar portions CL of the next line are arranged at half portions of the predetermined pitch with respect to the columnar portions CL of one line, and these arrangements are alternately repeated. In other words, the plurality of columnar portions CL is arranged in a hexagonal lattice shape in which the columnar portions CL are arranged at respective corners of the hexagon and the columnar portion CL is also located at the central portion of the hexagon. Furthermore, in other words, it can be said that the plurality of columnar portions CL is arranged in a trigonal lattice shape.

A coverage of the columnar portions CL arranged in the lowermost step SGb described above is, for example, 30.4%. The coverage of the columnar portions CL is calculated as follows, for example. First, a total sum Sc of areas occupied by the columnar portions CL arranged in the lowermost step SGb is obtained at the height position Ht of the upper surface of the wiring layer WRt. Further, an area St of the terrace portion of the lowermost step SGb is obtained (note that the terrace portion of the lowermost step SGb has an L shape in top view). More specifically, as illustrated on the right side in FIG. 2A, the area St of the terrace portion in this case is an area of a region marked off by an end portion (the leading end portion of the stepped portion SR) Esg of a stepped portion of the lowermost wiring layer WRb to which the lowermost step SGb belongs, both end portions Est of the wiring layer WRb divided by the slits STx, and a plurality of end portions Ex and Ey in the X direction and the Y direction of the wiring layer WR that is one layer upper than the wiring layer WRb and covering the lowermost wiring layer WRb. Then, a ratio of the total sum Sc of the areas of the columnar portions CL to the area St of the terrace portion, which is expressed in percentage, is the coverage of the columnar portions CL.

The left side in FIG. 2B illustrates a plan view at the height position Ht of the upper surface of the wiring layer WRt above the step SGxa adjacent in the X direction (the direction of the cell array portion AR) to the lowermost step SGb and the step SGyb adjacent in the Y direction to the step SGxa. As illustrated on the left side in FIG. 2B, a plurality of columnar portions CL is arranged in a staggered pattern in the step SGxa. Note that the columnar portion CL cannot be arranged around the contact CT arranged likewise in the step SGxa.

For this reason, the coverage of the columnar portions CL arranged in the step SGxa is, for example, 28.3%. The coverage of the columnar portions CL arranged in the step SGxa is similarly calculated to the above description. That is, a total sum Sc of areas occupied by the columnar portions CL arranged in the step SGxa is obtained at the height position Ht of the upper surface of the wiring layer WRt. Further, an area St of a rectangular terrace portion of the step SGxa is obtained. More specifically, as illustrated on the right side in FIG. 2B, the area St of the terrace portion in this case is an area of a region marked off by an end portion Esga of a stepped portion of the third wiring layer WR from the lowermost layer to which the step SGxa belongs, a one-side end portion Esta of the wiring layer WR divided by the it STx, and end portions Exa and Eya in the X direction and the Y direction of the wiring layer WR that is one layer upper and covering the wiring layer WR to which the step SGxa belongs. Then, a ratio of the total sum Sc of the areas of the columnar portions CL to the area St of the terrace portion, which is expressed in percentage, is the coverage of the columnar portions CL.

Here, the contact CT is also arranged in the lowermost step SGb. Nevertheless, the coverage of the columnar portions CL arranged in the lowermost step SGb is larger than the coverage of the columnar portions CL arranged in the step SGxa. This is because the lowermost step SGb has the terrace portion wider than the other steps such as the step SGxa. In the lowermost step SGb, the columnar portions CL are arranged on substantially the entire surface of the wide terrace portion. For this reason, in the lowermost step SGb, the influence of reduction in the coverage due to inability to arrange the columnar portion CL around the contact CT is decreased.

For a similar reason, the coverage of the columnar portions CL arranged in the lowermost step SGb is larger than coverages of the columnar portions CL arranged in the other steps SGxb, SGyb, and SGyc above the step SGxa. Each of such coverages is expressed by, for example, a ratio between a total sum Sc of areas of the columnar portions CL arranged in each of the other step SGxb, SGyb, and SGyc at the height position Ht of the upper surface of the wiring layer WRt, and an area St of the terrace portion of each of the other steps SGxb, SGyb, and SGyc. At this time, the area St of the individual terrace portion is similarly calculated to the area St of the terrace portion of the step SGxa, or the like, for each of the steps SGxb, SGyb, and SGyc.

(Example of Processing of Manufacturing Semiconductor Memory Device)

Figure 3A:
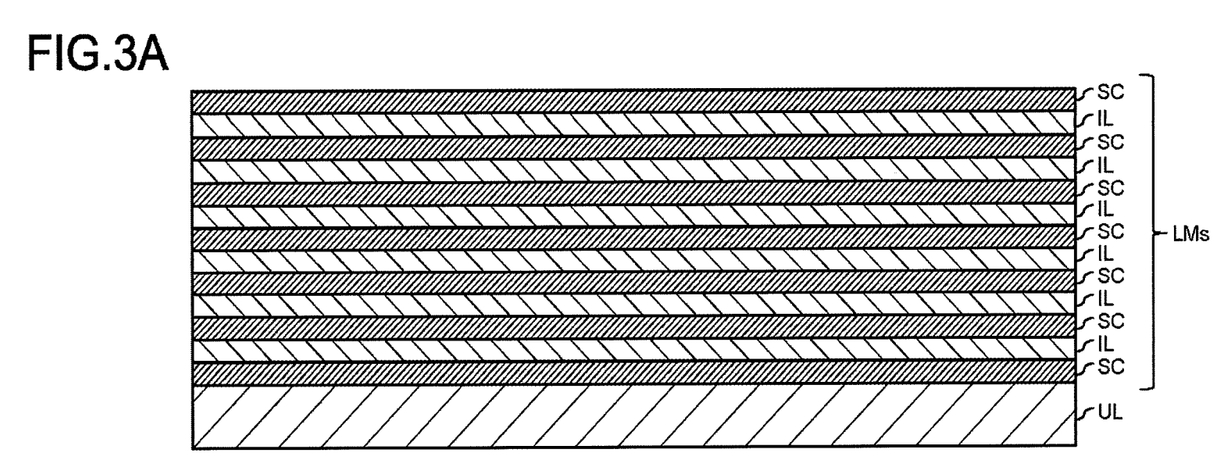
FIGS. 3A and 3B are flow views illustrating an example of a procedure of processing of manufacturing the semiconductor memory device according to the embodiment.

Next, an example of processing of manufacturing the semiconductor memory device 1 of the embodiment will be described with reference to FIGS. 3A and 7B. FIGS. 3A and 7B are flow views illustrating an example of a procedure of the processing of manufacturing the semiconductor memory device 1 according to the embodiment.

As illustrated in FIG. 3A, a stacked body LMs in which the plurality of insulating layers IL and a plurality of sacrificial layers SC are alternately stacked is formed on the base structure UL. The sacrificial layer SC is a layer replaceable with the wiring layer WR in a later process, and is, for example, a SiN layer or the like.

Figure 3B:
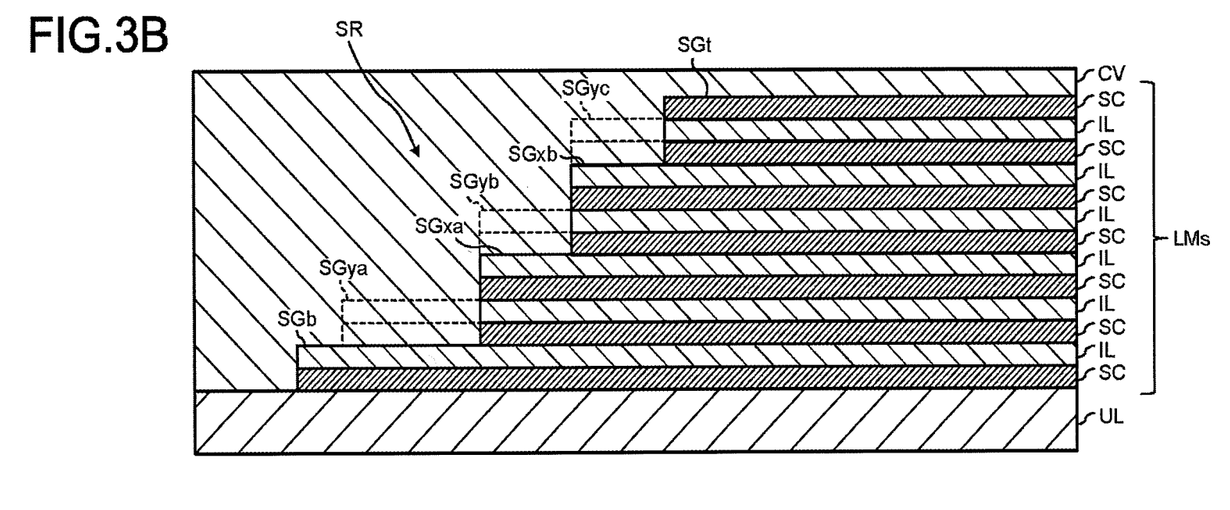

As illustrated in FIG. 3B, the insulating layers IL and the sacrificial layers SC in the end portion of the stacked body LMs are partially removed to form the stepped portion SR in the stacked body LMs. Then, the entire stacked body LMs is covered with the insulating layer CV.

Figure 4A:
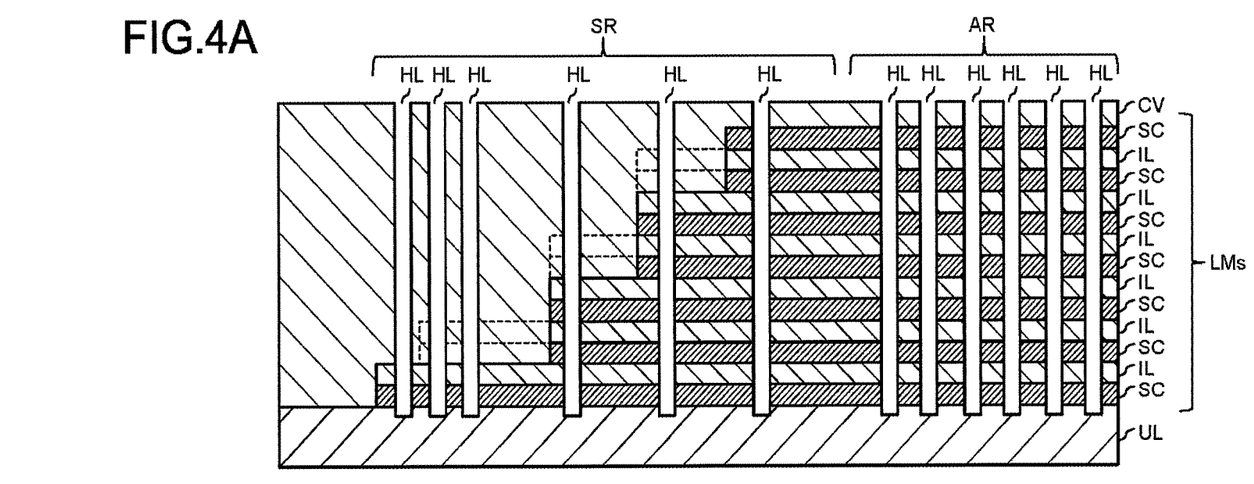
FIGS. 4A and 4B are flow views illustrating an example of a procedure of processing of manufacturing the semiconductor memory device according to the embodiment.

As illustrated in FIG. 4A, a plurality of holes HL that penetrates the stacked body LMs from the uppermost sacrificial layer SC to the lowermost sacrificial layer SC and reaches the base structure UL is formed in the cell array portion AR. In addition, a plurality of holes HL that penetrates the insulating layer CV above steps of the stepped portion SR and the steps and reaches the base structure UL is formed. The holes HL in the cell array portion AR and the holes HL in the stepped portion SR are collectively formed, for example.

Figure 4B:
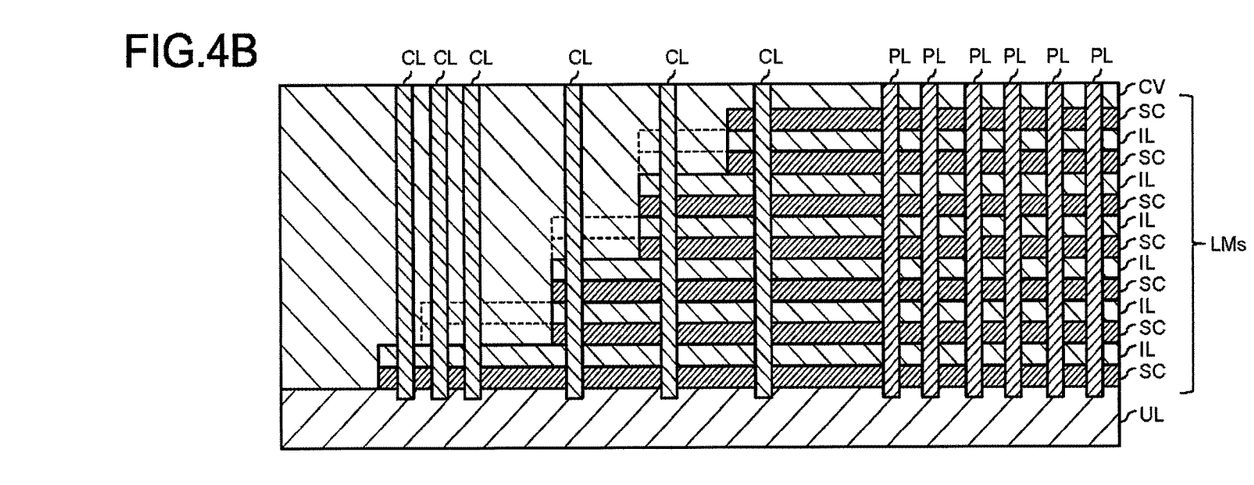

As illustrated in FIG. 4B, for example, the SiO₂ layer as the block insulating layer BK, the SiN layer as the charge storage layer CS, the SiO₂ layer as the tunnel insulating layer TN, the silicon layer as the channel layer CH, the SiO₂ layer as the core portion CR, and the like are formed in order from an inner wall side of the hole HL in each of the holes HL in the cell array portion AR. Thereby, the plurality of pillars PL is formed in the cell array portion AR.

Further, at this time, the $SiO_2$ layer, the SiN layer, the $SiO_2$ layer, the silicon layer, the $SiO_2$ layer, and the like described above are formed in order in the holes HL of the stepped portion SR. Thereby, the plurality of columnar portions CL is formed in the stepped portion SR.

As described above, the pillars PL of the cell array portion AR and the columnar portions CL of the stepped portion SR are collectively formed, for example. Note that the pillars PL and the columnar portions CL may be separately formed, and the columnar portion CL does not need to have a layer structure having the same configuration as the pillar PL.

Figure 5A:
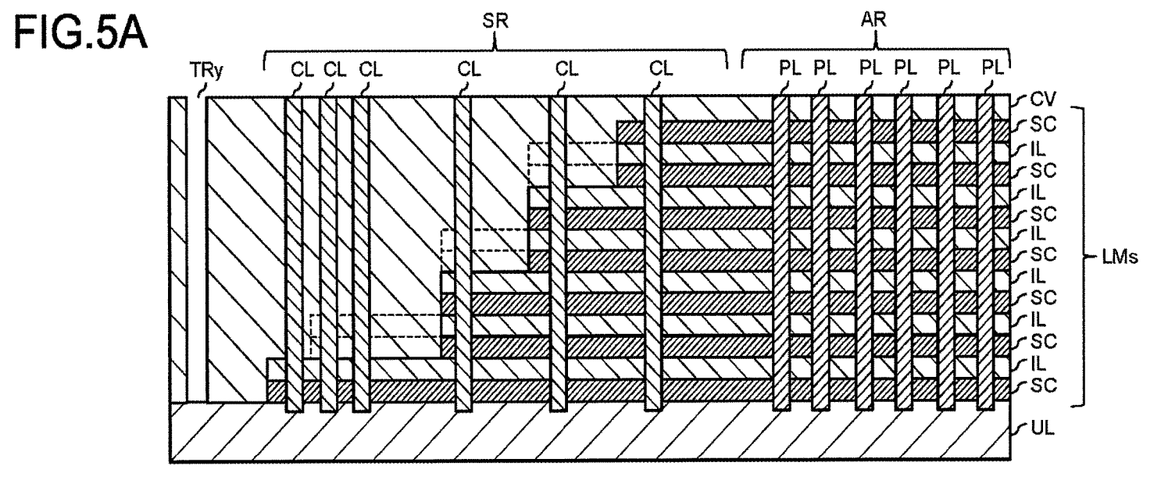
FIGS. 5A and 5B are flow views illustrating an example of a procedure of processing of manufacturing the semiconductor memory device according to the embodiment.

As illustrated in FIG. 5A, a trench TRy extending in the Y direction is formed near the leading end portion of the stepped portion SR. At this time, a trench (not illustrated) extending in the X direction is also formed through the stacked body LMs. The trench extending in the X direction is formed at the position of the slit STx in FIG. 1B.

Figure 5B:
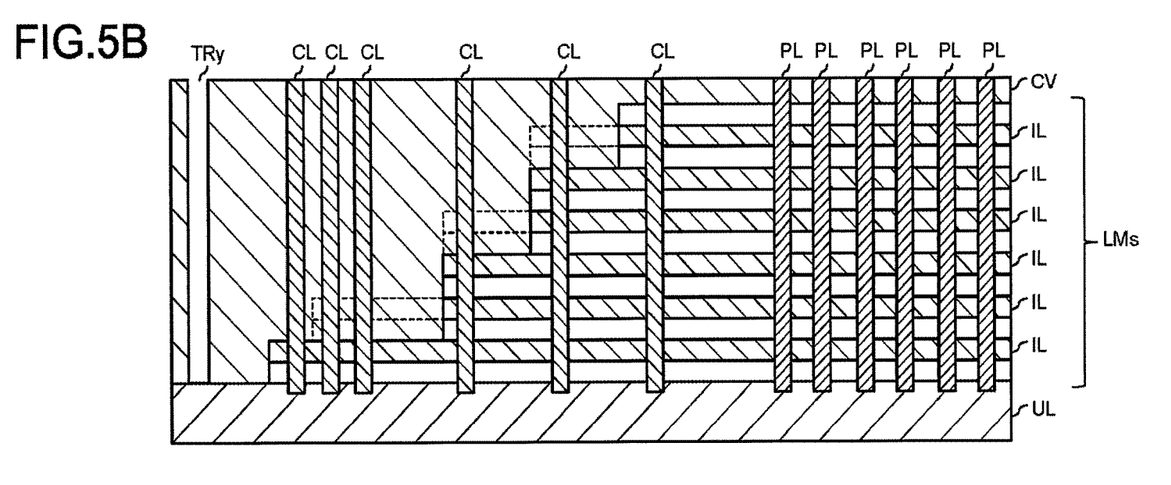

As illustrated in FIG. 5B, the sacrificial layers SC of the stacked body LMs are removed through the trench extending in the X direction. Thereby, gaps are generated between the respective insulating layers IL. The stacked body LMs including the gaps is supported by the plurality of pillars PL in the cell array portion AR and is supported by the plurality of columnar portions CL in the stepped portion SR.

Figure 6A:
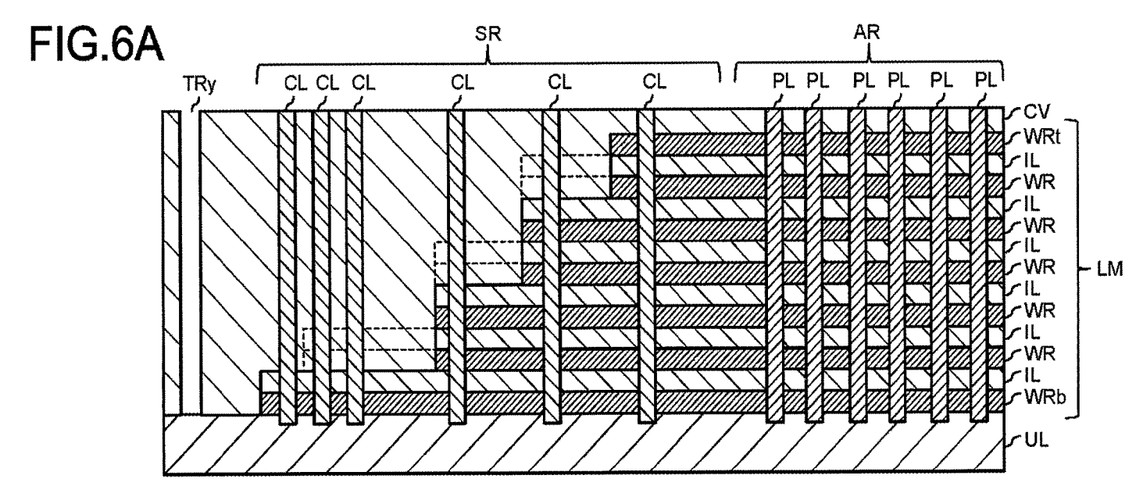
FIGS. 6A and 6B are flow views illustrating an example of a procedure of processing of manufacturing the semiconductor memory device according to the embodiment.

As illustrated in FIG. 6A, a metal material is filled in the gaps between the insulating layers IL through the trench extending in the X direction to form the wiring layers WR. Thereby, the stacked body LM in which the plurality of insulating layers IL and the plurality of wiring layers WR are alternately stacked is formed.

The processing in FIGS. 5B to 6A may be called replacement processing of replacing the sacrificial layer SC as an insulating layer with the wiring layer MR as a metal layer. The above-described wiring layers WRt and WRb correspond to the uppermost layer and the lowermost layer of the metal layers replaced by the replacement processing.

Figure 6B:
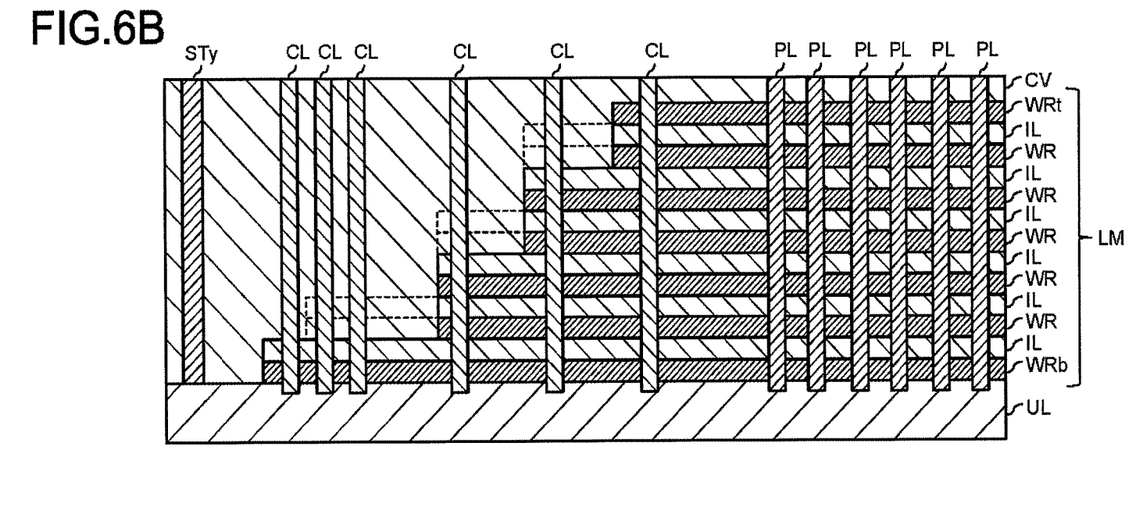

As illustrated in FIG. 6B, the trench TRy is filled with an insulating material to form the slit STy. At this time, the trench extending in the X direction is also filled with an insulating material to form the slit STx. Note that the trench extending in the X direction may be further filled with a conductive material to function as a source line contact.

Figure 7A:
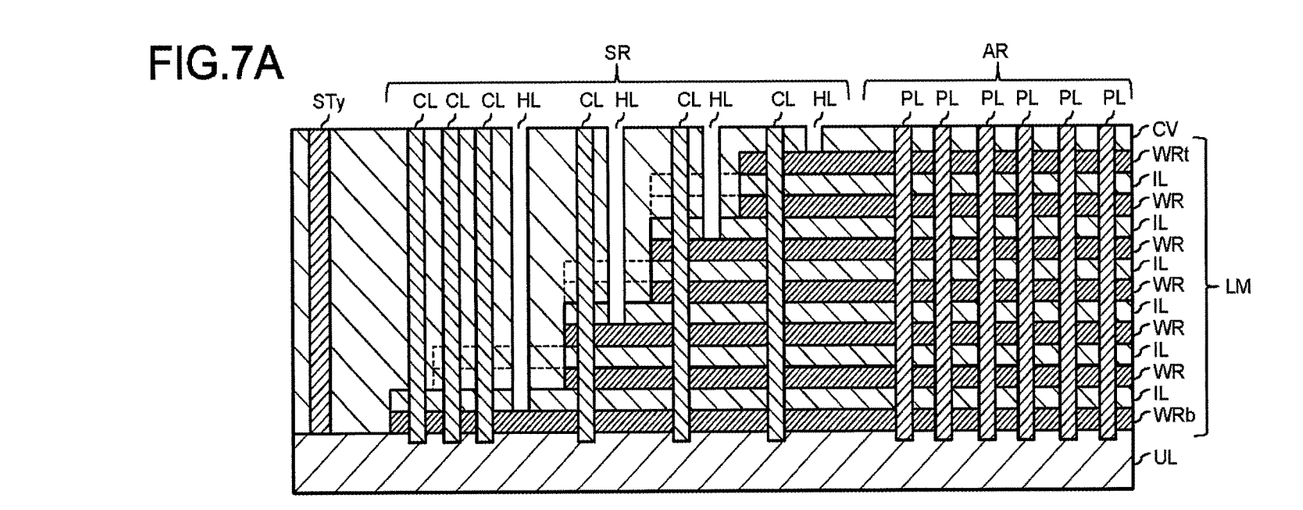
FIGS. 7A and 7B are flow views illustrating an example of a procedure of processing of manufacturing the semiconductor memory device according to the embodiment.
Figure 7B:
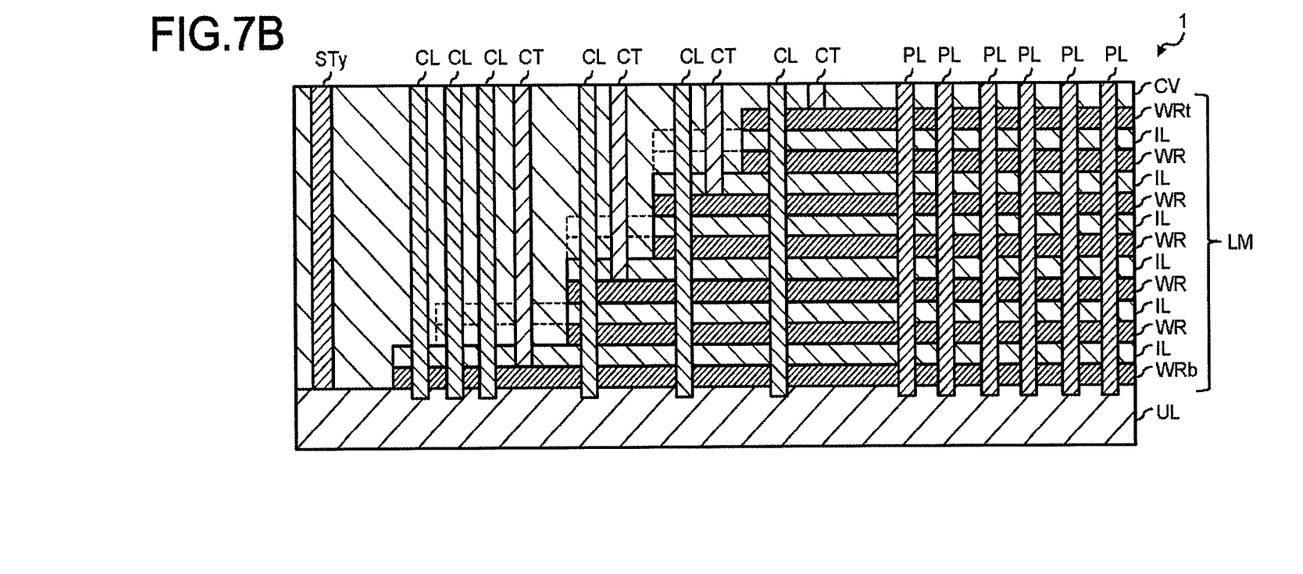

As illustrated in FIG. 7A, holes HL that penetrates the insulating layer CV and reach the wiring layers WR of the steps of the stepped portion SR are respectively formed.

As illustrated in FIG. 7B, each hole HL is filled with a conductive material to form the contact CT.

Thus, the processing of manufacturing the semiconductor memory device 1 of the embodiment is terminated.

As described above, the semiconductor memory device 1 according to the embodiment is manufactured through the state of the fragile stacked body LMs including the gaps after the removal of the sacrificial layers SC. How to maintain the strength of the stacked body LMs is an issue.

More specifically, stress toward the central portion of the stacked body LMs, that is, toward the direction of the cell array portion AR is generated in the stacked body LMs having the gaps, and bends the insulating layers IL. Factors of such stress include compressive stress by the insulating layer CV above the stepped portion SR, surface tension acting between the adjacent insulating layers IL by a removing liquid for the sacrificial layers SC, and the like. The slit STy cuts off the stacked body LMs from the peripheral region to suppress the stress toward the direction of the cell array portion AR.

Meanwhile, when the stress toward the direction of the cell array portion AR is relaxed by the slit STy, stress toward an opposite side, that is, toward an outside of the stacked body LMs is generated. The columnar portions CL arranged in the stepped portion SR relax the stress toward the outside the stacked body LMs. At this time, the columnar portion L near the slit STy is in particular susceptible to the stress toward the outside of the stacked body LMs.

For example, only by arranging columnar portions having the same shape as the pillars in a square lattice manner in top view in each step of the stepped portion, the columnar portions arranged in the lowermost step of the stepped portion near the slit cannot support the stacked body having the gaps against the stress toward the outside of the stacked body, and cracks starting from the columnar portions may occur on the stacked body.

According to the semiconductor memory device 1 of the embodiment, the plurality of columnar portions CL in the lowermost step SGb is arranged in a staggered pattern in top view. With the arrangement, the columnar portions CL can be arranged with a high coverage, and the stress toward the outside of the stacked body LMs can be relaxed to suppress the cracks in the stacked body LMs.

According to the semiconductor memory device 1 of the embodiment, the plurality of columnar portions CL has the same shape as the pillar PL and is configured by the same material, for example. Thereby, the columnar portions CL and the pillars PL can be collectively formed, and the number of processes of the processing of manufacturing the semiconductor memory device 1 is not increased.

(First Modification)

Figure 8A:
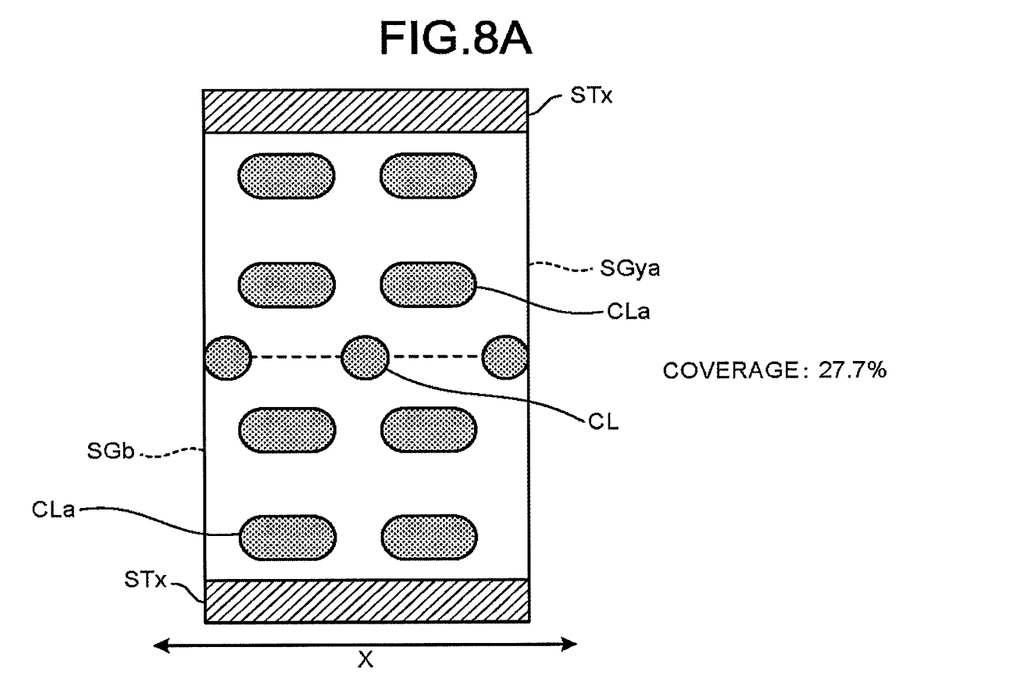
FIG. 8A and FIG. 8B are plan views illustrating an arrangement example of a columnar portion provided in a semiconductor memory device according to a first modification of the embodiment.
Figure 8B:
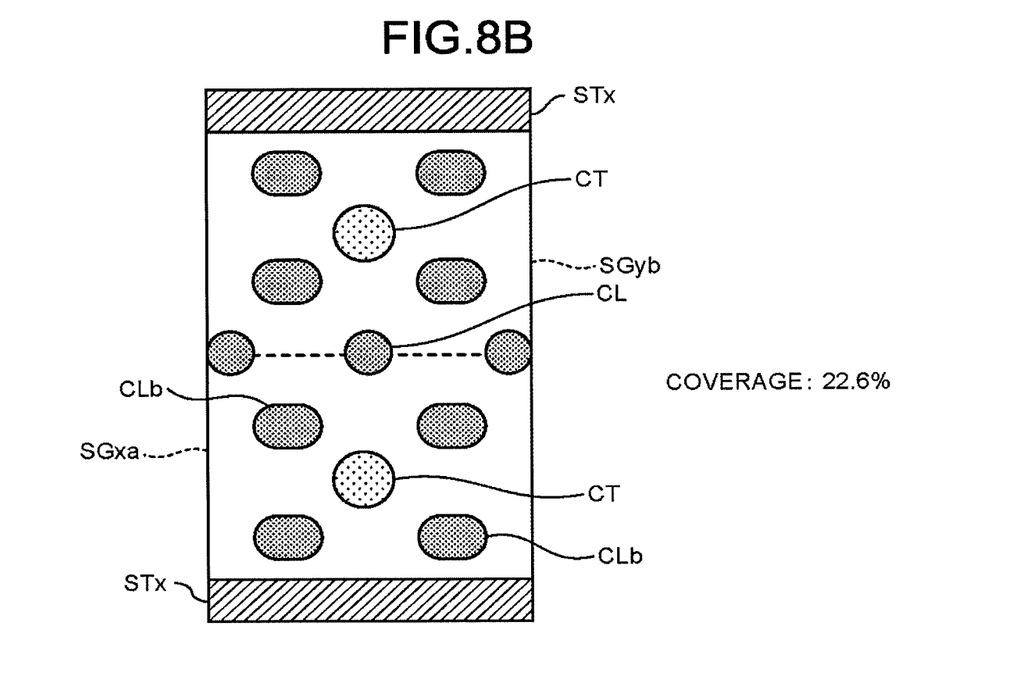

Next, a semiconductor memory device of a first modification of the embodiment will be described with reference to FIGS. 8A and 8B. FIGS. 8A and 8B are plan views illustrating an arrangement example of columnar portions CLa and CLb provided in the semiconductor memory device according to the first modification of the embodiment.

FIG. 8A is a plan view at the height position Ht (see FIG. 1A) of the upper surface of the wiring layer WRt above the lowermost step SGb and the step SGya adjacent both in the X direction and the Y direction to the lowermost step SGb. As illustrated in FIG. 8A, a plurality of the columnar portions CLa having an oval shape in top view is arranged in a square lattice pattern in the lowermost step SGb. In other words, the arrangement of the plurality of columnar portions CLa is a grid-like shape. At this time, a major axis of the oval-shaped columnar portion CLa is favorably directed in a stress direction, that is, in the X direction. A ratio of the major axis to a minor axis of the columnar portion CLa is, for example, 2.0 or less. The columnar portions CL having a shape close to a perfect circle in top view may be appropriately arranged between the oval-shaped columnar portions CLa. Thereby, the coverage of the columnar portions CLa and CL can be increased.

In the example in FIG. 8A, the coverage of the columnar portions CLa and CL arranged in the lowermost step SGb is, for example, 27.7%. The coverage of the columnar portions CLa and CL is similarly calculated to the above-described embodiment.

FIG. 8B is a plan view at the height position Ht of the upper surface of the wiring layer WRt above the step SGxa adjacent in the X direction (the direction of the cell array portion AR) to the lowermost step SGb and the step SGyb adjacent in the Y direction to the step SGxa. As illustrated in FIG. 8B, a plurality of the columnar portions CLb having an oval shape with a major axis shorter than the columnar portion CLa in the lowermost step SGb is arrayed in a square lattice pattern in the step SGxa. A ratio of the major axis to the minor axis of the columnar portion CLb is less than 1.5, for example. The reason why the major axis of the columnar portion CLb is made shorter than that of the columnar portion CLa is to avoid the contact CT arranged in the narrower step SGxa than the lowermost step SGb and to arrange the columnar portions CLb as close to the contact CT as possible. Ever in the step SGxa, the major axis of the columnar portion CLb is favorably directed in the X direction that is the stress direction. The columnar portions CL may be appropriately arranged between the columnar portions CLb.

In the example in FIG. 8B, the coverage of the columnar portions CLb and CL arranged in the step SGxa for example, 22.6%. The coverage of the columnar portions CLb and CL is similarly calculated to the above-described embodiment.

As described above, even in the first modification, the coverage of the columnar portions CLa and CL arranged in the lowermost step SGb is larger than the coverage of the columnar portions CLb and CL arranged in the step SGxa. Further, the coverage of the columnar portions CLa and CL arranged in the lowermost step SGb is larger than coverages of the columnar portions CLb and CL arranged in the other steps SGxb, SGyb, and SGyc above the step SGxa.

According to the semiconductor memory device of the first modification, the plurality of columnar portions CLa and CLb have the oval shapes. Thus, for example, the area of each of the columnar portions CLa and CLb can be increased compared to the columnar portion CL having substantially perfect circular shape in the embodiment, and the stress acting on the columnar portions CLa and CLb can be dispersed. Further, the second moment of area, which is an index of bending difficulty depending on the cross sectional shape of a certain structure, becomes large as the structure has a long cross section in a stress direction, that is, in a deformation direction. Therefore, for example, by directing the major axes of the columnar portions CLa and CLb in the stress direction, a stress relaxation effect superior to that of the semiconductor memory device 1 of the embodiment can be obtained even if the coverage lower than that of the columnar portions CL of the embodiment.

According to the semiconductor memory device of the first modification, the ratio of the major axis to the minor axis of the oval-shaped columnar portion CLa is set to 2.0 or less. Since the difference in the shape and the cross-sectional area of the columnar portion CLa from the pillar PL is sufficiently suppressed, the difference in processing characteristics between the columnar portion CLa and the pillar PL in forming the columnar portion CLa and the pillar PL is also suppressed within a predetermined range. Thereby, the columnar portions CLa and the pillars PL can be collectively formed. At this time, the columnar portions CLb having the ratio of the major axis to the minor axis of being less than 1.5 can also be collectively formed.

(Second Modification)

Figure 9:
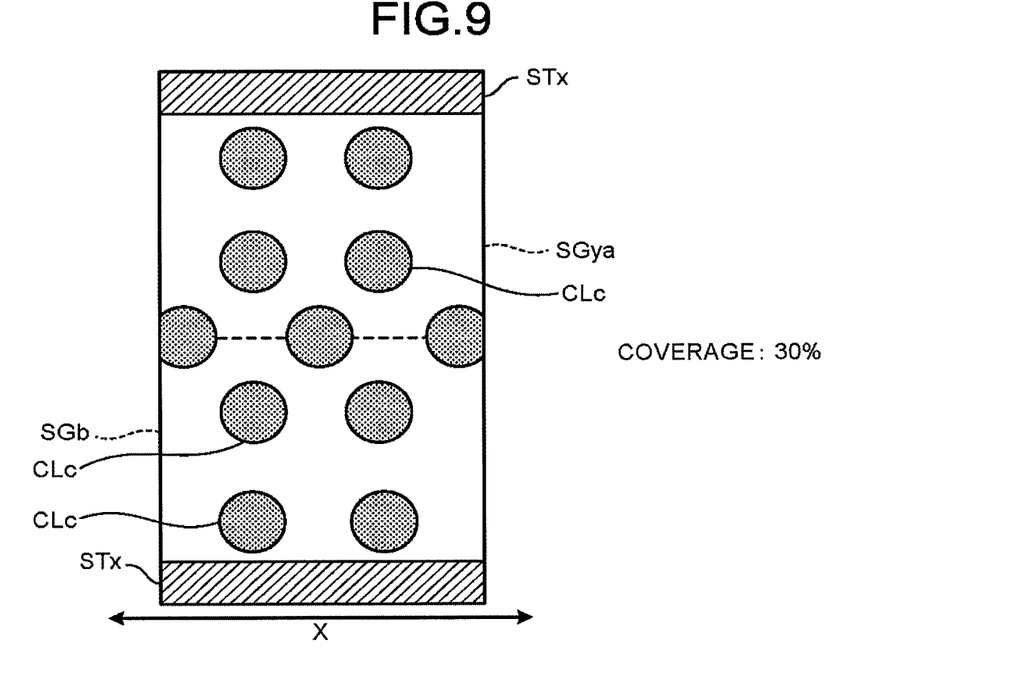
FIG. 9 is a plan view illustrating an arrangement example of a columnar portion provided in a semiconductor memory device according to a second modification of the embodiment.

Next, a semiconductor memory device of a second modification of the embodiment will be described with reference to FIG. 9. FIG. 9 is a plan view illustrating an arrangement example of columnar portions CLc provided in the semiconductor memory device according to the second modification of the embodiment.

FIG. 9 is a plan view at the height position Ht of the upper surface of the wiring layer WRt above the lowermost step SGb and the step SGya adjacent both in the X direction and the Y direction to the lowermost step SGb. As illustrated in FIG. 9, the columnar portions CLc having a shape close to a perfect circle with a diameter larger than the pillars PL are arrayed in a square lattice pattern in the lowermost step SGb. Some columnar portions CLc may be arranged at half positions of a pitch of the other columnar portions CLc, and parts of the columnar portions CLc may be arranged in a staggered pattern. The diameter of the columnar portion CLc is 1.4 times or less the diameter of the pillar PL, for example. By keeping the diameter of the columnar portion CLc at 1.4 times or less the diameter of the pillar PL, the columnar portions CLc and the pillars PL can be collectively formed.

In the example in FIG. 9, the coverage of the columnar portions CLc arranged in the lowermost step SGb is, for example, 30%. The coverage of the columnar portions CLc is similarly calculated to the above-described embodiment.

As described above, the second moment of area can also be increased by increasing the diameter of the columnar portion CLc. Further, the area where stress acts can be increased and dispersed. Therefore, the stress in the stacked body LMs can be relaxed to suppress the cracks in the stacked body LMs.

(Third Modification)

Figure 10:
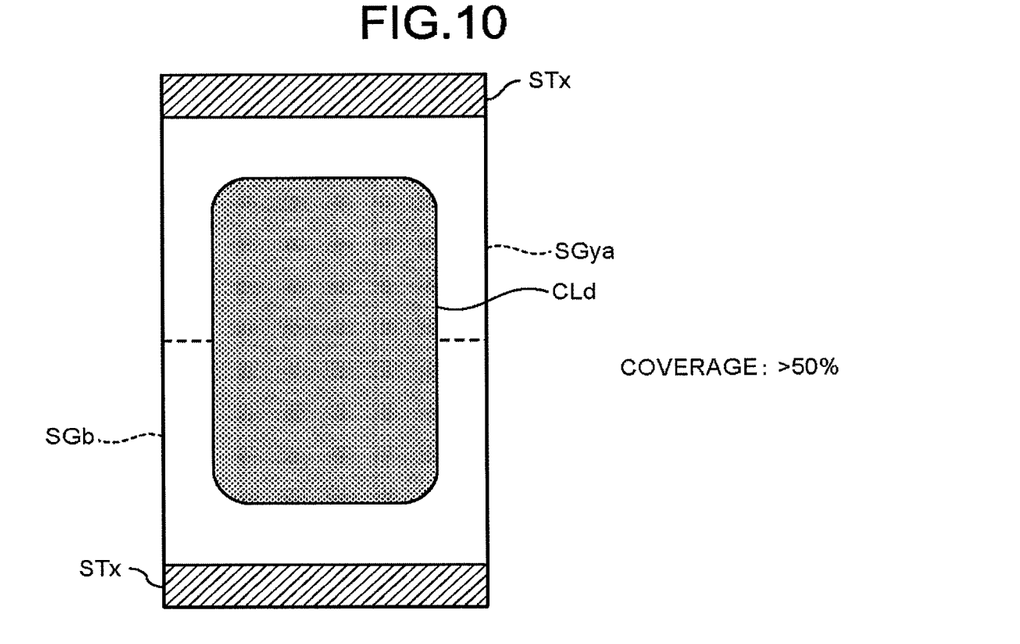
FIG. 10 is a plan view illustrating an arrangement example of a columnar portion provided in a semiconductor memory device according to a third modification of the embodiment.

Next, a semiconductor memory device of a third modification of the embodiment will be described with reference to FIG. 10. FIG. 10 is a plan view illustrating an arrangement example of a columnar portion CLd provided in the semiconductor memory device according to the third modification of the embodiment.

FIG. 10 is a plan view at the height position Ht of the upper surface of the wiring layer WRt above the lowermost step SGb and the step SGya adjacent both in the X direction and the Y direction to the lowermost step SGb. As illustrated in FIG. 10, a block-like columnar portion CLd is arranged in the lowermost step SGb.

By making the columnar portion CLd into a block shape, the size of the columnar portion CLd can be arbitrarily set, and the coverage of the columnar portion CLd can be increased to larger than 50%, for example. Thereby, in the semiconductor memory device of the third modification, a stress relaxation effect more superior to that of the semiconductor memory device of the first modification can be obtained.

However, it is difficult to collectively form such a columnar portion CLd together with the pillars PL, and the columnar portion CLd is separately formed. In this case, the columnar portion CLd can be configured by an insulating layer such as a $SiO_2$ layer or a SiN layer, for example. At this time, the configuration of the columnar portion CLd may be a single layer or a plurality of layers.

Example

Next, a configuration of an example will be described using FIGS. 11 and 12. Assuming a configuration corresponding to the above-described first modification as the configuration of the example, the risk of bending of the insulating layer in the stacked body having gaps between layers and the crack risk of the stacked body starting from the columnar portion were simulated.

The bending risk of an insulating layer and the crack risk of a stacked body were similarly simulated for a configuration of a comparative example with respect to the example. The comparative example had a configuration in which columnar portions having a similar perfect circular shape and a similar cross-sectional area to the above-described pillars PL are arranged in a grid-like shape. At this time, the coverage of the columnar portions arranged in a lowermost step was 22.2%, and the coverage of the columnar portions arranged in a step adjacent in an X direction to the lowermost step was 15.6%.

Figure 11:
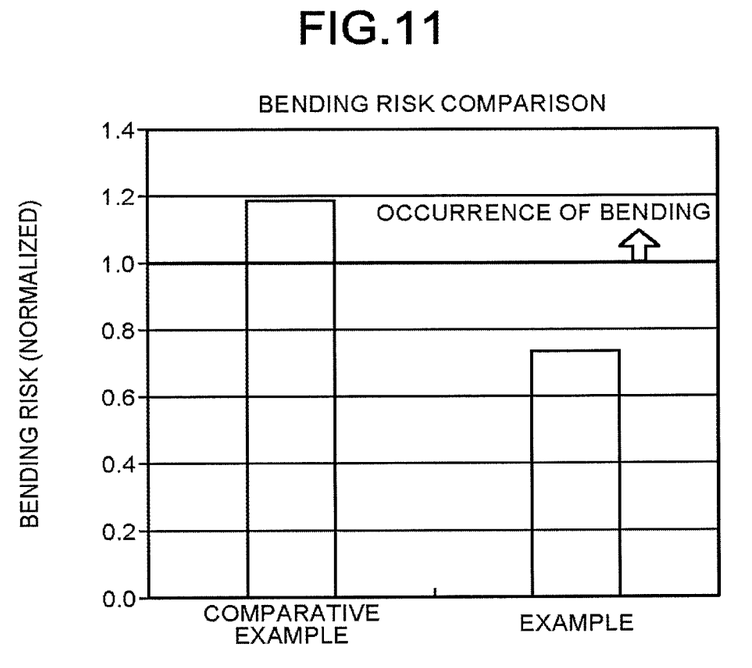
FIG. 11 is a graph simulating a bending risk of an insulating layer in a stacked body having a gap between layers of a configuration according to an example.

FIG. 11 illustrates bar graphs of the bending risk of the insulating layer. The vertical axis of the bar graphs represents normalized bending risk. At this time, when the bending risk becomes 1.0 or more, bending occurs in the insulating layer stacked in the stacked body. As illustrated in FIG. 11, in the configuration of the comparative example, the bending risk is close to 1.2, and occurrence of the bending in the insulating layer is predicted. Meanwhile, in the configuration of the example, the bending risk is less than 0.8, and suppression of the bending of the insulating layer is predicted.

Figure 12:
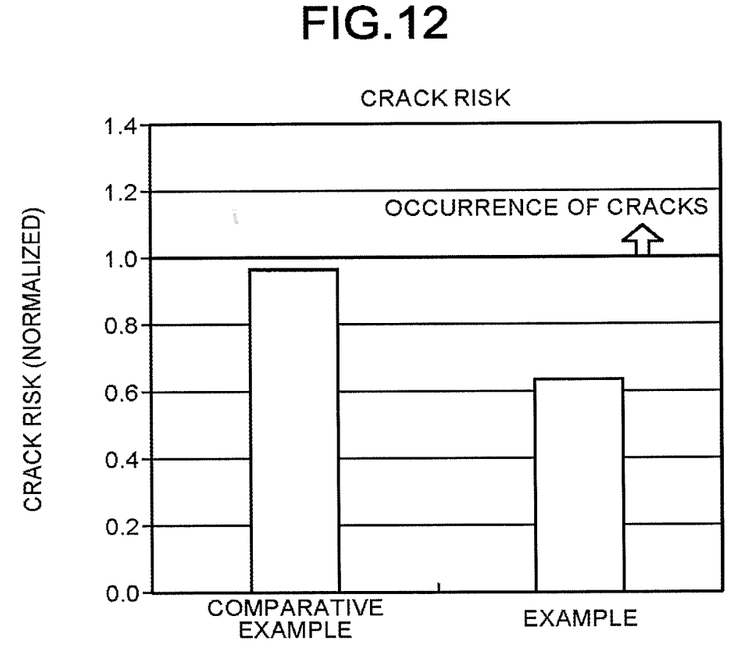
FIG. 12 is a graph that simulates a crack risk of the stacked body starting from the columnar portion of the configuration according to an example.

FIG. 12 illustrates bar graphs of the crack risk of the stacked body. The vertical axis of the bar graphs represents normalized crack risk. At this time, when the crack risk becomes 1.0 or more, cracks occur in the stacked body. As illustrated in FIG. 12, in the configuration of the comparative example, the crack risk is close to 1.0, and occurrence of cracks in the stacked body is predicted. Meanwhile, in the configuration of the example, the crack risk is 0.6 or more, and suppression of the cracks in the stacked body is predicted.

As described above, it has been found that, by forming the columnar portion into an oval shape in top view and increasing the coverage of the columnar portions arranged in the lowermost step to 25% or more, the stress of the stacked body is relaxed, and the bending of the insulating layer in the stacked body and the cracks in the stacked body can be suppressed.

In the above-described embodiment and modifications, the columnar portions CL and the like are arranged in the stepped portion SR. However, the columnar portions may be arranged in the cell array portion AR as well.

In the above-described first modification, the columnar portions CLa and CLb have the oval shapes in top view. However, the columnar portions may have an elliptical shape or a rectangular shape as a shape for improving the second moment of area. In other words, the columnar portion has a shape having anisotropy in top view. The shape having anisotropy is not limited to the above-described oval shape, elliptical shape, or rectangular shape, and is a shape including at least one longitudinal direction and one short direction. By forming the columnar portion into an anisotropic shape, the density in the Y direction of a limited space on a predetermined terrace portion can be increased and the second moment of area in the X direction can be increased.

In the above-described embodiment and modifications, the pillar PL has a substantially perfect circular shape in top view. However, the pillar may have an oval shape or an elliptical shape.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a stacked body having a stepped portion in which a plurality of metal layers is stacked via an insulating layer, and end portions of the plurality of metal layers are formed in a stepwise manner;
   a plurality of pillars extending in a stacking direction of the stacked body to penetrate the stacked body from an uppermost metal layer to a lowermost metal layer of the stacked body, and forming a plurality of memory cells at respective intersections with at least metal layers arranged near a center of the stacked body, of the plurality of metal layers;
   a plurality of columnar portions arranged in steps of the stepped portion and penetrating the stepped portion; and
   a band portion provided near a leading end portion of the metal layer of a lowermost step of the stepped portion, the band portion extending in a first direction along the leading end portion and dividing the stacked body and a peripheral region of the stacked body, wherein
   a coverage of the columnar portions arranged in the lowermost step is larger than a coverage of the columnar portions arranged in an upper step adjacent to the lowermost step only in a second direction toward a region where the memory cells are arranged.

2. The semiconductor memory device according to claim 1, wherein
   the coverage of the columnar portions arranged in the lowermost step is 25% or more.

3. The semiconductor memory device according to claim 2, wherein
   the coverage of the r portions is calculated on the basis of a total sum of areas occupied by the plurality of columnar portions at a same height position as an upper surface of the uppermost metal layer.

4. The semiconductor memory device according to claim 1, wherein
   a diameter of at least one of the columnar portions arranged in the lowermost step is larger than a diameter of the pillars and is 1.4 times or less the diameter of the pillars.

5. The semiconductor memory device according to claim 1, wherein
   at least one of the columnar portions has a shape having anisotropy including a longitudinal direction and a short direction in top view, and
   the longitudinal direction of at least one of the columnar portions is directed to a direction along the second direction.

6. The semiconductor memory device according to claim 5, wherein
   at least one of the columnar portions has an oval shape, an elliptical shape, or a rectangular shape in top view.

7. The semiconductor memory device according to claim 5, wherein
   a ratio of the longitudinal direction to the short direction of at least one of the columnar portions is 2.0 or less.

8. The semiconductor memory device according to claim 5, wherein
   at least another one of the columnar portions has a substantially perfect circular shape in top view.

9. The semiconductor memory device according to claim 5, wherein
   a ratio of the longitudinal direction to the short direction of at least one of the columnar portions arranged in the lowermost step is larger than a ratio of a longitudinal direction to a short direction of at least one of the columnar portions arranged in the upper step adjacent to the lowermost step only in the second direction.

10. The semiconductor memory device according to claim 1, wherein
the band portion is arranged at a position within from the leading end portion of the metal layer of the lowermost step of the stepped portion.

11. The semiconductor memory device according to claim 1, wherein
the lowermost step of the stepped portion is arranged at a position in the second direction between the band portion and the upper step adjacent to the lowermost step only in the second direction.

12. A semiconductor memory device comprising:
a stacked body having a stepped portion in which a plurality of metal layers is stacked via an insulating layer, and end portions of the plurality of metal layers are formed in a stepwise manner;
a plurality of pillars extending in a stacking direction of the stacked body to penetrate the stacked body from an uppermost metal layer to a lowermost metal layer of the stacked body, and forming a plurality of memory cells at respective intersections with at least metal layers arranged near a center of the stacked body, of the plurality of metal layers;
a plurality of columnar portions arranged in steps of the stepped portion and penetrating the stepped portion; and
a band portion provided near a leading end portion of the metal layer of a lowermost step of the stepped portion, the band portion extending in a first direction along the leading end portion and dividing the stacked body and a peripheral region of the stacked body, wherein
a coverage of the columnar portions arranged in the lowermost step is 25% or more.

13. The semiconductor memory device according to claim 12, wherein
the coverage of the columnar portions is calculated on the basis of a total sum of areas occupied by the plurality of columnar portions at a same height position as an upper surface of the uppermost metal layer.

14. The semiconductor memory device according to claim 12, wherein
a diameter of at least one of the columnar portions arranged in the lowermost step is larger than a diameter of the pillars and is 1.4 times or less the diameter of the pillars.

15. The semiconductor memory device according to claim 12, wherein
at least one of the columnar portions has a shape having anisotropy including a longitudinal direction and a short direction in top view, and
the longitudinal direction of at least one of the columnar portions is directed to a second direction orthogonal to the first direction.

16. The semiconductor memory device according to claim 15, wherein
at least one of the columnar portions has an oval shape, an elliptical shape, or a rectangular shape in top view.

17. The semiconductor memory device according to claim 15, wherein
a ratio of the longitudinal direction to the short direction of at least one of the columnar portions is 2.0 or less.

18. The semiconductor memory device according to claim 15, wherein
at least another one of the columnar portions has a substantially perfect circular shape in top view.

19. The semiconductor memory device according to claim 12, wherein
the band portion is arranged at a position within 5 μm from the leading end portion of the metal layer of the lowermost step of the stepped portion.

20. The semiconductor memory device according to claim 12, wherein
the lowermost step of the stepped portion is arranged at a position in a second direction between the band portion and an upper step adjacent to the lowermost step only in the second direction, the second direction being orthogonal to the first direction.

* * * * *